(12) United States Patent
Verbrugge

(10) Patent No.: US 7,612,532 B2
(45) Date of Patent: Nov. 3, 2009

(54) METHOD FOR CONTROLLING AND MONITORING USING A STATE ESTIMATOR HAVING VARIABLE FORGETTING FACTORS

(75) Inventor: Mark W. Verbrugge, Troy, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 453 days.

(21) Appl. No.: 11/272,169

(22) Filed: Nov. 10, 2005

(65) Prior Publication Data

US 2006/0284600 A1 Dec. 21, 2006

Related U.S. Application Data

(60) Provisional application No. 60/692,381, filed on Jun. 21, 2005.

(51) Int. Cl.
*H02J 7/00* (2006.01)
(52) U.S. Cl. .................................................. 320/132
(58) Field of Classification Search .............. 320/132; 324/426, 427; 702/63–65
See application file for complete search history.

(56) References Cited

U.S. PATENT DOCUMENTS

2003/0076109 A1 * 4/2003 Verbrugge et al. .......... 324/427

OTHER PUBLICATIONS

Vahidi, Ardalan, Simultaneous Mass and Time-Varying Grade Estimation for Heavy-Duty Vehicles, Proc. of American Control Conf, Jun. 4, 2003, pp. 4951-4956, IEEE, Denver, Colorado.
Parkum, J E, Recursive Forgetting Algorithms, Int. J. Control, 1992, pp. 109-128, vol. 55, No. 1, Publisher: Taylor & Francis, Ltd, unknown location.
Kulhavy, R, On a General Concept of Forgetting; Int. J. Control, 1993, pp. 905-924, vol. 58, No. 4, Publisher Taylor & Francis, Ltd. unknown location.
Zheng, Yuanjin, Recursive Adaptive Algorithms for Fast and Rapidly Time-Varying Systems, IEEE Transactions on Circuits and Systems, Sep. 2003, pp. 602-614, vol. 50, No. 9, IEEE.
Bittanti, S, Deterministic Convergence Analysis of RLS Estimators with Different Forgetting Factors, Proc. of 27th Conf. on Decision and Control, Dec. 1988, pp. 1530-1531, IEEE.
Fortescue, T.R., Implementation of Self-Tuning Regulators with Variable Forgetting Factors, Automatica, 1981, pp. 831-835, vol. 17, No. 6, Pergamon Press Ltd, GB.
Ljung, L., Adaptation and tracking in System Identification—A Survey Automatica, 1990, pp. 7-21, vol. 26, No. 1, Pergamon Press, Ltd, GB.

* cited by examiner

*Primary Examiner*—Edward Tso
*Assistant Examiner*—Ramy Ramadan

(57) ABSTRACT

A recursive algorithm is provided for adaptive multi-parameter regression enhanced with forgetting factors unique to each regressed parameter. Applications of this algorithm can include lead acid batteries, nickel-metal hydride batteries, and lithium-ion batteries, among others. A control algorithm is presented, having an arbitrary number of model parameters, each having its own time-weighting factor. A method to determine optimal values for the time-weighting factors is included, to give greater effect to recently obtained data for the determination of a system's state. A methodology of weighted recursive least squares is employed, wherein the time weighting corresponds to the exponential-forgetting formalism. The derived mathematical result does not involve matrix inversion, and the method is iterative, i.e. each parameter is regressed individually at every time step.

9 Claims, 8 Drawing Sheets

| Parameter, Units | Value |
|---|---|
| $R$, mohm | 1.637 |
| $E$ | 0.905 |
| $A_d$, 1/F | $8.000 \times 10^{-5}$ |
| $\beta$, 1/C | $1.122 \times 10^{-4}$ |
| $V_o$, V | 3.9 |
| $r = C_{D,dis}/C_{D,chg}$ | 0.75 |

| | |
|---|---|
| $C_{D,dis}$, F | 12500 |
| $C_{D,chg}$, F | 16667 |
| $\tau$, s | 5.00 |
| $R_{ct,dis}$, mohm | 0.4 |
| $R_{ct,chg}$, mohm | 0.3 |

| | |
|---|---|
| $V_{H,max}$, mV | 20 |
| $Ah$ | 4.2 |

*FIG. 9*

METHOD FOR CONTROLLING AND MONITORING USING A STATE ESTIMATOR HAVING VARIABLE FORGETTING FACTORS

CROSS-REFERENCE TO RELATED APPLICATIONS

This application claims priority from U.S. Provisional Application U.S. Provisional No. 60/692,381 filed Jun. 21, 2005, entitled METHOD FOR CONTROL AND MONITORING USING A STATE ESTIMATOR HAVING VARIABLE FORGETTING FACTORS.

TECHNICAL FIELD

This invention pertains generally to control algorithms and systems, and more specifically to a control algorithm for estimating an operating state.

BACKGROUND OF THE INVENTION

For efficient energy management of an electrical energy storage system comprising batteries or supercapacitors, an adaptive algorithm that can characterize the state of the energy-storage device is required. Inputs to the algorithm can include the system current, voltage, and temperature, and outputs characterize the energy content (i.e., state of charge, or 'SOC', predicted power capability (i.e., state of power, or 'SOP'), and performance relative to the new and end-of-life condition (i.e., state of health, or 'SOH'). For automotive applications, the conversion of input information to outputs for vehicle control must occur quickly, while not requiring substantial amounts of computer storage, consistent with embedded-controller and serial-data-transfer capabilities. Generally these two limitations mandate that algorithms be fully recursive, wherein all information utilized by the algorithm stems from previous time-step values and measurements that are immediately available.

To construct a state estimator for the SOC, SOH, and SOP, model reference adaptive systems have been employed. In a typical approach, a model of the plant, e.g., a battery, is constructed, and the parameters appearing in the model are regressed from the available measurements. For example, using an equivalent circuit as depicted with reference to FIG. 1, a mathematical expression may be constructed for the battery, and the values of the circuit elements can be regressed from the available current, voltage, and temperature data during ongoing vehicle operation. One method of using weighted recursive least squares ('WRLS') with exponential forgetting has proven to be a pragmatic approach for parameter regression, when model reference adaptive systems are employed. The time-weighting of data is damped exponentially with this approach; hence, new data has a preferential impact in determining the value of regressed parameters and thus the state of the system.

Two shortfalls arise in a standard implementation of WRLS. First, a single forgetting factor is typically employed for all parameters, even where different parameters may have significantly different temporal considerations. Secondly, the value of the forgetting factors cannot be optimized for each parameter, due to use of a single, common factor. The result of such implementation of WRLS is a state estimator for state of charge (SOC), state of health (SOH), and state of power (SOP) of a battery or other system that lacks accuracy and reliability due to such compromises.

Therefore, what is needed is a state estimator for SOC, SOH, and SOP that is able to provide a more accurate prediction of those values. This need for a more accurate state estimator for state of charge is important, for example, on modern vehicle systems with highly efficient battery control for an electric vehicle, or, for control of a hybrid electric vehicle.

SUMMARY OF THE INVENTION

A state estimator is presented which addresses the problems of the prior art by calculating and using a unique individual forgetting factor for each parameter of interest in the state estimation program. The state estimator program of interest is enhanced by providing an optimizing function for each of the parameters. The presented method comprises a weighted recursive least squares method with exponential forgetting, having a plurality of forgetting factors, each forgetting factor assigned to an individual parameter to be regressed. Furthermore, a method is provided to determine an optimal value of the forgetting factors. The state estimator program with optimized individual forgetting factors is preferably applied to battery applications, including to a high-power-density lithium ion battery being used in an exemplary fuel cell vehicle.

A generalized recursive algorithm for adaptive multi-parameter regression is enhanced with forgetting factors unique to each regressed parameter. Newton's method is employed to determine the optimal values of the forgetting factors, although other standard methods for numerically solving nonlinear problems can be used. Applications of this algorithm include lead acid batteries, nickel-metal hydride batteries, and lithium-ion batteries. A smaller forgetting factor, which provides a greater weighting to more recent data, has been found to be appropriate for regressed open-circuit voltage, $V_o$, whereas a larger forgetting factor has been found to be appropriate for high-frequency resistance. These findings are consistent with rapid changes in the SOC (state of charge) and $V_o$(SOC) for high-power cycling with relatively stable values of resistance, R, for batteries employing insertion electrodes. Employing a variable forgetting factor for a charge-sustaining hybrid vehicle utilizing a lithium ion battery increases the accuracy of the algorithm performance by about 50%, in terms of assessing the power-projection capability, and the accuracy is enhanced significantly with respect to determining the remaining energy in the battery (SOC) and the state of health. The derived mathematical result does not involve matrix inversion, and the method is iterative, i.e. each parameter is regressed individually at every time step.

A control algorithm is developed and implemented that accommodates an arbitrary number of model parameters, with each model parameter having its own time-weighting factor. A method to determine optimal values for the time-weighting factors is included. Time-weighting factors are employed to give greater effect to recently obtained data for the determination of a system's state. A methodology of weighted recursive least squares is employed, wherein the time weighting corresponds to the exponential-forgetting formalism. The output from the adaptive algorithm is the battery state of charge, i.e., remaining energy, state of health relative to the battery's nominal performance, and predicted power capability. Results are presented for a high-power lithium ion battery.

Therefore, in accordance with the invention, an article of manufacture is provided, including a method to estimate a state of a device using an executable multivariate mathematical model comprising a summation of a plurality of sensed inputs. Each sensed input is factored by a corresponding weighting factor and by a corresponding parameter. Each corresponding parameter is determined by: sensing each input at a time-certain, and deriving a weighted recursive least squares equation from the executable multivariate mathematical model. The weighted recursive least squares equation is executed to calculate the corresponding parameter using: the sensed inputs, the weighting factors, and non-corresponding parameters.

An aspect of the invention includes the method to estimate a state of the device is executed recursively.

Another aspect of the invention includes estimating a state of a device comprises estimating a-state of charge of an electrical energy storage device.

Another aspect of the invention includes executing the weighted recursive least squares equation using: the sensed inputs at the time-certain, the weighting factors, and, the non-corresponding parameters determined at a preceding time-certain.

Another aspect of the invention includes decaying at least one of the weighting factors using exponential forgetting factors, including decaying based upon elapsed time.

Another aspect of the invention includes decaying at least one of the weighting factors based upon a characteristic of the device.

These and other aspects of the invention will become apparent to those skilled in the art upon reading and understanding the following detailed description of the exemplary embodiments.

BRIEF DESCRIPTION OF THE DRAWINGS

The invention may take physical form in certain parts and arrangement of parts, the preferred embodiment of which will be described in detail and illustrated in the accompanying drawings which form a part hereof, and wherein.

DETAILED DESCRIPTION OF THE INVENTION

Figure 1:
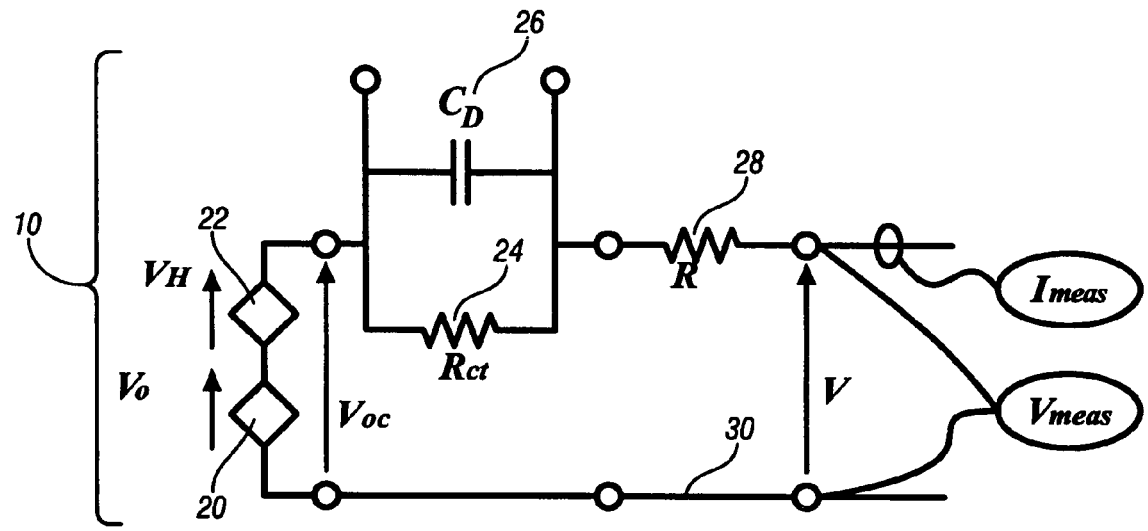
FIG. 1 is a schematic diagram of an electrical circuit, in accordance with the present invention.

Referring now to the drawings, wherein the showings are for the purpose of illustrating the invention only and not for the purpose of limiting the same, FIG. 1 shows a representative model of a device, in this embodiment an electrical energy storage device, or battery, which has been constructed in accordance with an embodiment of the present invention.

The exemplary battery 10 is preferably mathematically modeled to include a voltage source and an impedance source. The voltage source includes an open circuit voltage, $V_O$, 20 and a hysteresis voltage, $V_H$ 22. The impedance source includes internal impedance, represented by a resistance value, $R_{CT}$, 24, in ohms, and a capacitive discharge value, $C_D$ 26, measured in units of farads. There is a resistance, R, 28, in ohms, comprising resistance in the conducting cables of the electrical circuit, and a ground return line 30. A measured output voltage, $V_{meas}$, and output current, $I_{meas}$, comprise parameters by which the battery 10 is evaluated by a controller (not shown).

The battery 10 is preferably monitored and controlled by an electronic controller containing machine-executable code operable to sense one or more operating parameters, in this instance the measured output voltage, $V_{meas}$, and output current, $I_{meas}$, and, battery temperature, each discretely and synchronously sampled. Output data is provided in one or more formats to communicate a state of charge of the device, in this case the battery.

The controller is preferably a general-purpose digital computer generally comprising a microprocessor or central processing unit, read only memory (ROM), random access memory (RAM), electrically programmable read only memory (EPROM), high speed clock, analog to digital (A/D) and digital to analog (D/A) circuitry, and input/output circuitry and devices (I/O) and appropriate signal conditioning and buffer circuitry. The controller may include a plurality of output drivers for controlling a corresponding plurality of output devices, each operable to control the system in which the battery 10 is employed, such as a hybrid-electric vehicle. The controller is attached to sensing devices and output devices via wiring harnesses, to monitor and control operation of other elements of the system. The controller includes software code comprising resident program instructions embedded in ROM, including control algorithms and logic. The control algorithms preferably use predetermined calibrations stored in ROM, and other stored values derived during execution of the algorithms, to provide the functions described hereinafter. The controller is operable to recursively execute algorithms during preset loop cycles, for example each 3, 6, 15, 25 and 100 milliseconds of machine operation. Other algorithms may be executed in response to some form of interrupt signal sent to the controller. Use of the controller to monitor and control operation of a system is well known to one skilled in the art.

In this embodiment, the controller is operable to execute algorithms to recursively estimate a state of electrical charge of the battery device. An executable multivariate mathematical model of the battery operable to estimate the state of charge is constructed for implementation as an algorithm in the controller. The mathematical model comprises an equation consisting of a sum of a plurality of sensed data signals, wherein each sensed data signal is multiplied, or factored, by a corresponding weighting factor, and further multiplied, or factored, by an individual parameter. The data signals are sensed at a time-certain, typically corresponding to one of the predetermined controller loop cycles. Each of the parameters is updated each loop cycle in which the mathematical model operable to estimate the state of charge is executed. This comprises creating a weighted recursive least squares equation to calculate each parameter, based upon the executable multivariate mathematical model of the device. The weighted recursive least squares equation is executed to calculate each of the parameters. Executing the weighted recursive least squares equation to calculate an individual corresponding parameter for a specific time-certain, i.e. for the specific loop-cycle, comprises executing the equation using the sensed data signals sensed during that loop-cycle the time-certain and the weighting factors. The equation is further executed by holding the remaining non-corresponding parameters unchanged from those parameters determined at a preceding time-certain, i.e. determined during the previous loop-cycle. Executing the weighted recursive least squares equation with these values, a specific parameter is thus updated. The controller repeatedly executes the weighted recursive least squares equation algorithm to calculate and update new values for each of the parameters. The final step of the algorithm execution each loop cycle comprises estimating the state of battery charge by executing the algorithm comprising the multivariate mathematical model of the device, using the updated plurality of parameters, the sensed data signals at the time-certain, and the weighting factors. This is described in detail hereinbelow.

A parameter regression method is described, with the instantaneous error $\epsilon$ (often referred to as the loss term), $$\epsilon(t)=[y-(m_1x_1+m_2x_2+\ldots+m_Lx_L+b)],$$

wherein y represents the experimentally obtained dependent variable at time t (i.e., $y=V_{measured}$, the measured voltage for the exemplary energy storage system) and the values $x_1, x_2, \ldots, x_L$ represent the measured quantities on which the L parameters $m_1, m_2, \ldots, m_L$ multiply, respectively, to complete the linear model once the parameter b (resulting from a regressed open-circuit potential in the case of energy storage devices) is included. An iterative scheme is formulated that does not require matrix inversion, thus b is folded into the parameter vector, $m=[m_1,m_2,\ldots,m_L]^T$, recognizing that the corresponding value of x associated with b is unity, as will be made clear hereinbelow, with reference to Eq. 14. The error term summed over N data points can be expressed as follows, using Eq. 1:

$$\varepsilon = \sum_{j=1,N} \gamma_j \lambda^{N-j}[y_j - (m_1 x_{1,j} + m_2 x_{2,j} + \ldots + m_{L,j} x_{L,j})]^2. \quad [1]$$

For a system wherein only one of the L parameters changes with time, designated as $m_l$, and all others correspond to fixed values, the error associated with the single parameter l is shown in Eq. 2, below:

$$\varepsilon_l = \sum_{j=1,N} \gamma_{l,j} \lambda_l^{N-j}\left[y_j - m_l x_{l,j} - \sum_{\substack{k=1,\\k\neq l}}^{k=L} m_k x_{k,j}\right]^2. \quad [2]$$

Two clarifications must be provided for Eqs. 1 and 2. First, there are instances when some data is given more or less weighting on a basis other than time. For example, the equivalent circuit model employed to correlate battery behavior does not address gassing reactions on charge, and a larger weighting value may be chosen for discharge data relative to charge data. For this reason, the composite weight factor corresponds to $\gamma\lambda$, with the factor $\gamma$ provided so as to selectively weight various data, whereas $\lambda$ corresponds to the standard exponential forgetting factor for time-weighting data; larger, composite weight factors give rise to larger effects on the error $\epsilon$ and thus more influence with regard to evaluating the parameters $m_l$. As noted previously, all of the L parameters may vary with time. The preferred approach is to allow only one parameter (denoted by subscript l) to change relative to its previously calculated value, and the remaining, non-corresponding L-1 parameters are fixed at their values obtained from the previous time step, i.e., at their regressed values corresponding to time $t-\Delta t$ and the integer time index, $j=N-1$ for the data point N. Thus Eq. 2 specifies that the exponential forgetting factor $\lambda$ is to be associated with a parameter l.

Consistent with Eqs. 1 and 2, the total error, $\epsilon$, may be written as the sum of the L individual errors, as shown in Eq. 3:

$$\varepsilon = \sum_{l=1,L} \varepsilon_l = \quad [3]$$

$$\sum_{l=1,L}\sum_{j=1,N} \gamma_{l,j}\lambda_l^{N-j}\left[y_j(t) - m_l(t)x_{l,j}(t) - \sum_{\substack{k=1,L\\k\neq l}} m_k(t-\Delta t)x_{k,j}(t)\right]^2.$$

By minimizing the error $\epsilon$ with respect to $m_l$ at time step N, employing Eq. 3 to determine $\partial\epsilon/\partial m_l(t)=0$, to obtain an equation for the l'th parameter $m_l$, shown in Eq. 4:

$$m_{l,N} = \frac{1}{\sum_{j=1,N} \gamma_{l,j}\lambda_l^{N-j} x_{l,j}^2} \quad [4]$$

$$\left(\sum_{j=1,N} \gamma_{l,j}\lambda_l^{N-j} y_j x_{l,j} - \sum_{\substack{k=1,L\\k\neq l}} m_{k,N-1} \sum_{j=1,N} \gamma_{l,j}\lambda_l^{N-j} x_{k,j} x_{l,j}\right).$$

This relation is used to regress individually each of the L parameters at time step N, and provide an expression reflecting a weight factor $\lambda_1$ for each of the L parameters $m_1$. Eq. 4 is implemented L times at each time step, with the value of l ranging from 1 to L. Thus there are no matrix equations to solve in this approach, and the method can be viewed as iterative.

A mathematical model to estimate a state of charge of the battery device is now described, applying the aforementioned calculation of error, $\epsilon$, as follows. The state of charge is taken as a weighted average (weight factor $W_{SOC}$) of values extracted by coulomb integration and voltage-based modeling, using Eq. 5:

$$SOC=w_{SOC}(SOC_C)+(1-w_{SOC})(SOC_V) \quad [5]$$

Coulomb-based state of charge, $SOC_C$, is determined as follows, using Eq. 6:

$$SOC_C(t) = SOC(t-\Delta t) + \int_{t-\Delta t}^{t}\left[100\frac{\eta_I I}{Ah_{nominal}} - S_D\right]\frac{dt}{3600}. \quad [6]$$

Voltage-based state of charge, $SOC_V$, is be determined by inverting a voltage expression for the cell derived from the equivalent circuit depicted in FIG. 1, so as to extract the open-circuit potential, as shown in Eq. 7, below:

$$V = V_{oc} + IR - A\int_{\zeta=t}^{\zeta=0} I(\zeta)\exp[-B(t-\zeta)]d\zeta. \quad [7]$$

Eqs. 6 and 7 are recast in recursive forms as follows in Eq. 8:

$$SOC_C(t) = SOC_{t-\Delta t} + \left[\frac{100}{Ah_{nominal}}\left\{\frac{(\eta_I I)_{t-\Delta t}+(\eta_I I)_t}{2}\right\} - S_D\right]\frac{\Delta t}{3600} \quad [8]$$

and Eq. 9:

$$V_t = (V_{oc}+IR)_t + \left(\frac{I_{t-\Delta t}+I_t}{2}\right)A_d r\Delta t + \exp(-B\Delta t)(V-V_{oc}-IR)_{t-\Delta t}. \quad [9]$$

Time is represented by t and I denotes current; discharge currents are taken as negative. Nominal capacity, $Ah_{nominal}$, corresponds to the ampere-hours of capacity the battery delivers when discharged from 100% SOC to 0% SOC at low rates of discharge. Self-discharge rate, $S_D$, and current efficiency, $\eta_I$, typically vary with both temperature and SOC. The factor 3600 has units of seconds per hour, and the factor 100 is employed to keep a consistent percent basis. Parameters A and B correspond to $A=1/C_D$ and $B=1/(R_{ct}C_D)=1/\tau$, wherein $\tau$ is viewed as a time constant. $A_d$ is the inverse of the capacitance on discharge, and r is the ratio of A for charge to that of discharge; represented as:

$$r(T,SOC) = A_c/A_d = C_{D,discharge}/C_{D,charge}.$$

Open-circuit potential $V_{oc}$ is a function of temperature, $SOC_V$, and a hysteresis function, as shown in Eq. 10, below:

$$V_{oc} = V_o(T, SOC_V) + V_H. \quad [10]$$

A look-up table can be used to determine the $SOC_V$ once the value of $V_o$ is obtained. For the hysteresis contribution, the following first-order differential equation is constructed to calculate hysteresis voltage $V_H$, using Eqs. 11 and 12:

$$\frac{\partial V_H}{\partial t} = \beta(\eta_I I - S_D)[V_{H,max} - \text{sign}(I)V_H], \quad [11]$$

and, $$(V_H)_t \approx (V_H)_{t-\Delta t} + \beta \Delta t \{(\eta_I I - S_D)[V_{H,max} - \text{sign}(I)V_H]\}_{t-\Delta t}. \quad [12]$$

For prolonged charge currents, or short but very large charge currents, the hysteresis voltage tends to about $V_{H,max}$. The exact opposite holds for discharge currents, in which case the hysteresis voltage tends to $-V_{H,max}$. Note that when the current remains at zero for a long time, the hysteresis voltage tends to the charge-decreasing condition through self-discharge. The parameters in this equation (including $V_{H,max}$) may be temperature- and SOC-dependent. While hysteresis plays a critical role in nickel-metal hydride batteries, it is far less important in lead acid and lithium ion systems.

By combining the hysteresis and cell voltage expressions, Eq. 13 is obtained:

$$V_t = V_o + (V_H)_{t-\Delta t} + \beta \Delta t ((\eta_I I - S_D)[V_{H,max} - \text{sign}(I)V_H])_{t-\Delta t} + \quad [13]$$

$$I_t R + \left(\frac{I_{t-\Delta t} + I_t}{2}\right) A_d r \Delta t + E(V - V_{oc} - IR)_{t-\Delta t},$$

where $E = \exp(-\Delta t/\tau)$. Eq. 13 is the basis for assignments provided with reference to Eq. 14, below.

$$y = V^{measured}|_t \quad [14]$$

$$x_1 = I_t$$

$$x_2 = (V^{measured} - V_{oc} - IR)_{t-\Delta t}$$

$$x_3 = \left(\frac{I_{t-\Delta t} + I_t}{2}\right)[r_{(I_t + I_{t-\Delta t})/2}]\Delta t$$

$$x_4 = w_H \Delta t \{(\eta_I I - S_D)[V_{H,max} - \text{sign}(I)V_H]\}_{t-\Delta t}$$

$$x_5 = 1$$

$$m_1 = R$$

$$m_2 = \exp(-B\Delta t) = e^{-\Delta t/\tau} = E$$

-continued $$m_3 = A_d$$

$$m_4 = \beta$$

$$m_5 = V_o + (V_H)_{t-\Delta t}.$$

Power-projection capability is now constructed. First, note that the maximum discharge power is expressed as:

$$P_{max,discharge} = IV = IV_{min}.$$

That is, when the battery voltage obtains its lowest acceptable value, the maximum discharge power results. Ohmic battery power capability is preferably referred to as $P_{max,discharge}$, shown in Eq. 15:

$$P_{max,discharge} = IV_{min} = \frac{(V_{min} - V_{oc})}{R} = V_{min}, \quad [15]$$

consistent with $V = V_{oc} + IR$ for an ohmic battery. Similarly, the maximum charge power, $P_{max,charge}$, of the ohmic battery is given with reference to Eq. 16:

$$P_{max,charge} = IV_{max} = \frac{(V_{max} - V_{oc})}{R} = V_{max}. \quad [16]$$

For the maximum ohmic resistance, obtained at long times (low frequency), R is replaced by $R + R_{ct}$, wherein $R_{ct}$, is different for charge and discharge. The ohmic battery does not address transient effects such as those correlated by the superposition integral. To improve the estimate, Eq. 13, above, is used to calculate the power for maximum charge, $P_{max,charge}$ and discharge $P_{max,discharge}$ available for the time interval $\Delta t$, as shown in Eq. 17, below:

$$I|_t = -\frac{(V_{oc} - V)_t + (AI_{t-\Delta t}\Delta t/2) + \exp(-B\Delta t)[V - (V_{oc} + IR)]_{t-\Delta t}}{R + (A_d r\Delta t/2)} \quad [17]$$

$$P_{max,discharge}(\Delta t) = IV_{min}$$

$$= \left[-\frac{(V_{oc} - V_{min})_t + (A_d I_{t-\Delta t}\Delta t/2) +}{\exp(-B\Delta t)[V - (V_{oc} + IR)]_{t-\Delta t}}\right] V_{min}$$

$$P_{max,charge}(\Delta t) = IV_{max}$$

$$= \left[-\frac{(V_{oc} - V_{max})_t + (A_c I_{t-\Delta t}\Delta t/2) +}{\exp(-B\Delta t)[V - (V_{oc} + IR)]_{t-\Delta t}}\right] V_{max}$$

wherein it is recognized that r=1 on discharge. To implement these equations, the respective powers are calculated immediately after the algorithm has been employed to finish the SOC determination at time t. In this case, quantities calculated or measured at time t are stored in the variables listed in the respective power expressions at time $t-\Delta t$. The duration corresponding to the desired estimate for power must be stated. For example, to determine the power estimates three seconds from "now", the measured and extracted values are placed in the $t-\Delta t$ quantities, $\Delta t$ is set to three seconds, and the right sides of the above equations yield the desired power estimates.

Referring now to an embodiment of the invention, exemplary data was gathered for this analysis, and the independently measured parameter values, at room temperature, are provided in table form in FIG. 9. In FIG. 9, the cell parameters comprise: the ratio r is fixed, and the uppermost five rows correspond to nominal values (independently measured) for the adapted parameters in the weighted recursive least squares ('WRLS') algorithm. The middle five rows ($C_{D,dis}$ to R) correspond to electrochemical parameters of interest that are extracted from the above parameters. For all plots shown in this work, the charge current efficiencies were taken to be unity, Skew_cal=10 and $\gamma=1$.

Figure 2:
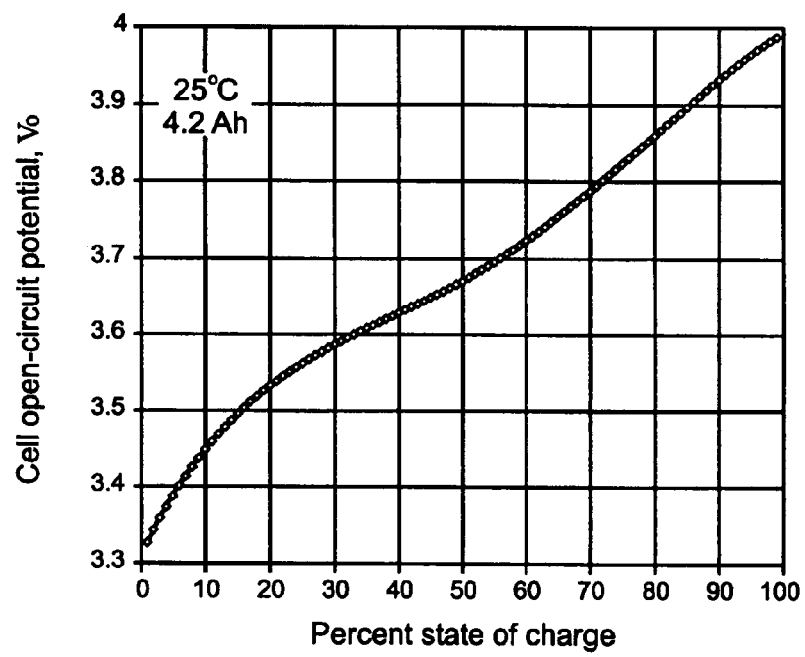
FIG. 2-8 comprise exemplary data graphs, in accordance with the present invention; and, FIG. 9 is a table of exemplary parameters, in accordance with the present invention.

In this exemplary embodiment, the open-circuit potential $V_o$ for the exemplary lithium ion battery is shown with reference to FIG. 2. The hysteresis parameter, $\beta$, is bounded between 0.5 and 2 times the nominal value listed in FIG. 9. The high-frequency resistance R varies over a range between 0.05 and 20 times the nominal value listed in FIG. 9, and the parameter E varies over a range between 0.5 and 0.95. The parameter $A_d$ varies over a range between 0.8 and 3 times the nominal value listed in FIG. 9. It is understood that these parametric values and ranges are exemplary and may be different for other battery systems, while still being within the scope of the invention.

Figure 3A:
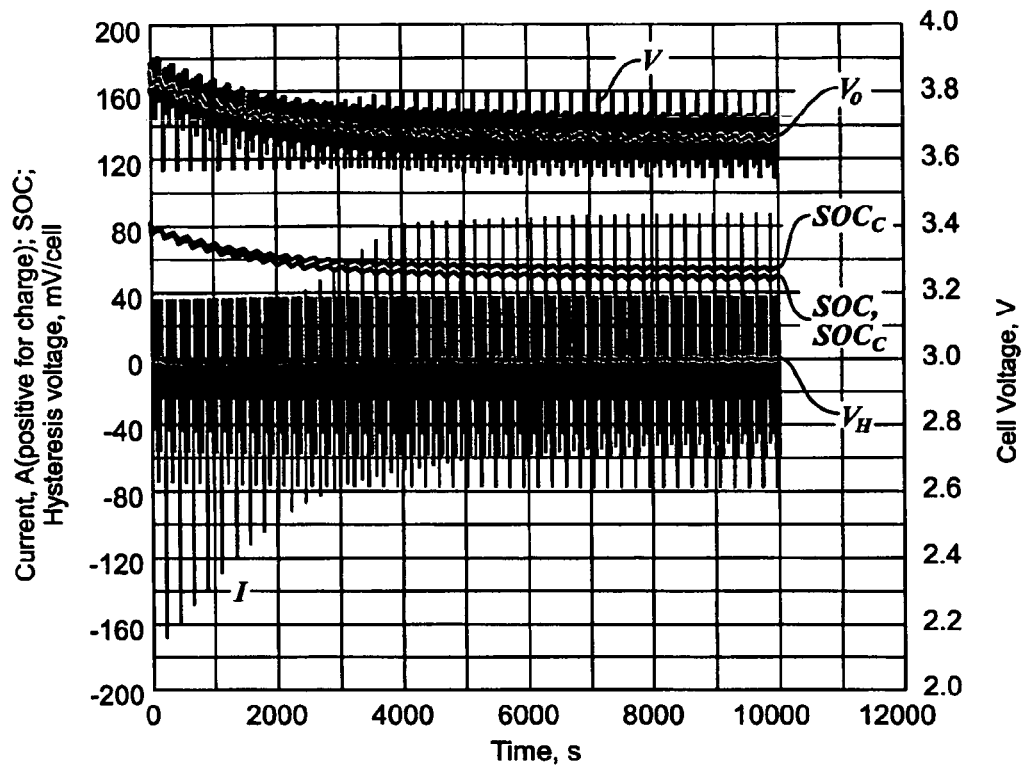
Figure 3B:
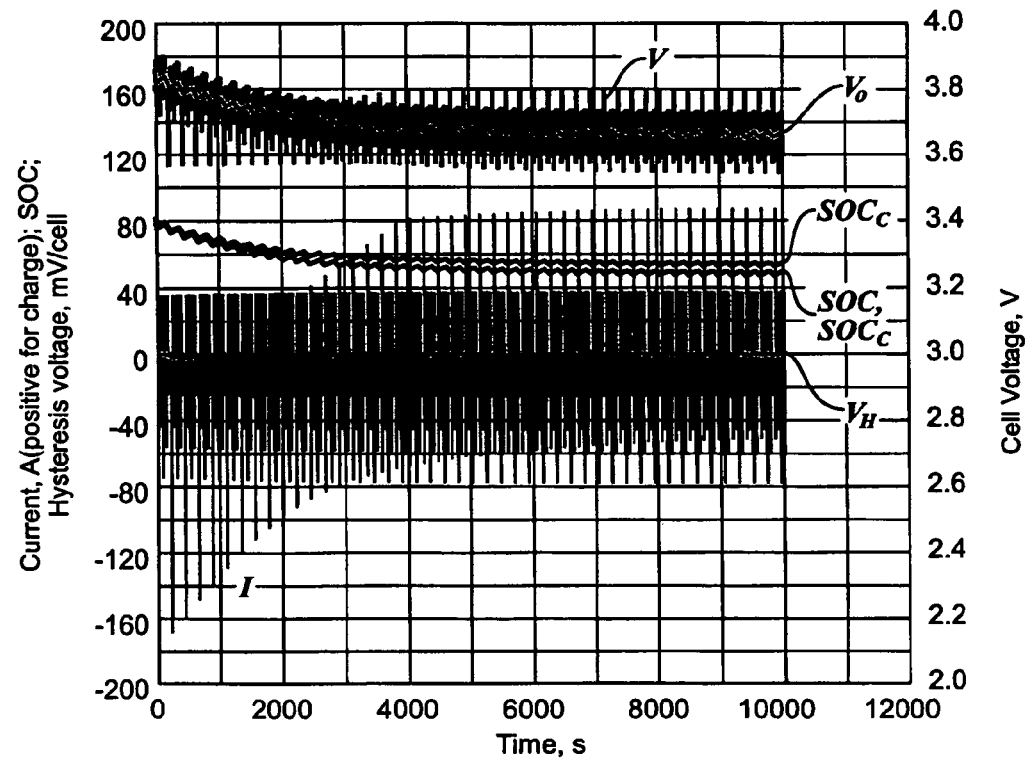

Referring now to FIG. 3, a state of charge and measured voltage (V), equilibrium voltage ($V_o$) and hysteresis voltage ($V_H$) as a function of time, are shown in FIG. 3. FIG. 3A shows state of charge and measured voltage (V), equilibrium voltage ($V_o$) and hysteresis voltage ($V_H$) for a fixed forgetting factor of 0.9847. FIG. 3B shows state of charge and measured voltage (V), equilibrium voltage ($V_o$) and hysteresis voltage ($V_H$) for optimized, variable forgetting factors. Discharge of the battery at the completion of the indicated experiment yielded a capacity that was within $\pm 2.5$ percent of the final SOC (about 50 percent at the end of the experiment described herein with reference to FIG. 3). For the case of fixed and variable forgetting factors, the error for the entire data set (10,000 seconds in the case of FIG. 3, with the time per data point being 0.5 seconds and N=20,000) was minimized to find the optimal values. The error is defined to be minimized as shown in Eq. 18, below:

$$\varepsilon_{opt} = \sum_{j=1,N} [V_j^{measured} - V_j^{model}]^2 \qquad [18]$$

$$= \sum_{j=1,N} \left[ V_j^{measured} - \sum_{k=1,L} m_{k,j} x_{k,j} \right]^2$$

Figure 5A:
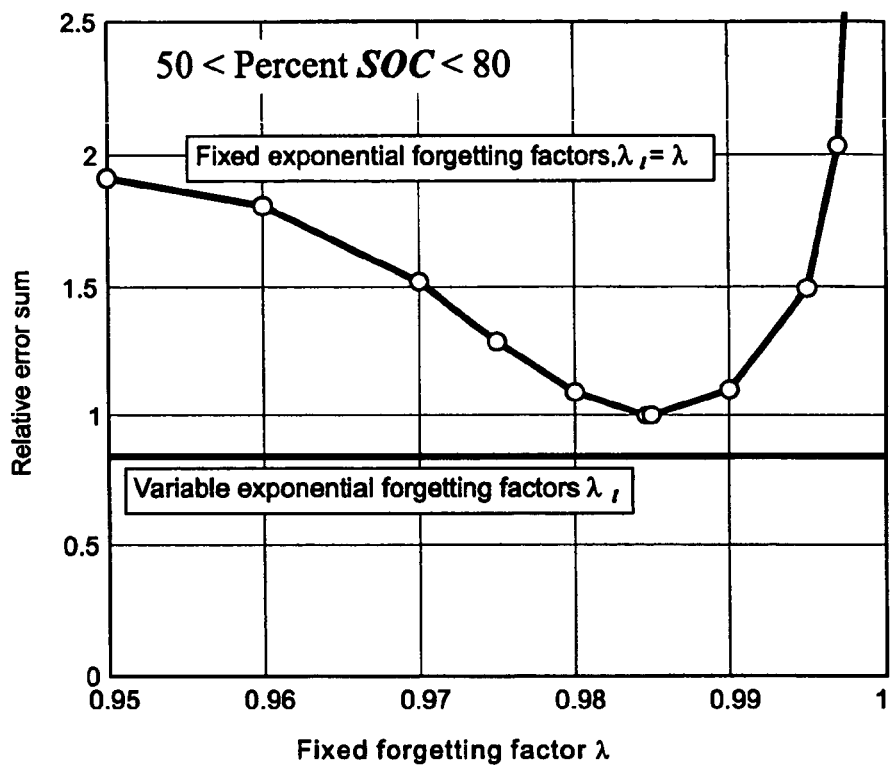
Figure 5B:
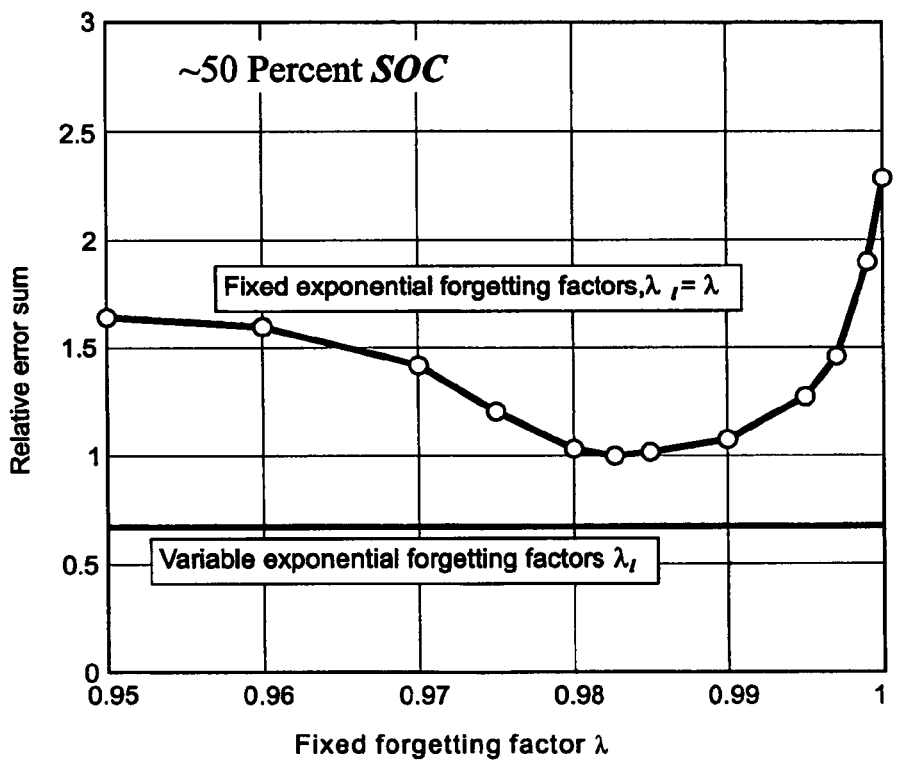

Newton's method, known to a skilled practitioner, is employed to optimize the forgetting factors, as shown in Eq. 19, below:

$$\lambda^{(n+1)} = \lambda^{(n)} - \frac{\varepsilon_{opt}^{(n)}}{\varepsilon_{opt}^{\prime(n)}}, \qquad [19]$$

wherein $\varepsilon'_{opt}(\lambda)$ is a Jacobian matrix of the error term minimized by determining the optimal values of the forgetting factor vector $\lambda$ for the entire data set; the superscript (n) refers to the step in the Newton iteration. For this work, convergence ($\lambda_l^{(n+1)}/\lambda_l^{(n)} < 10^{-6}$) was obtained in about 6 iterations. For a fixed forgetting factor (shown in FIGS. 5A and 5B), the optimal value of $\lambda$ was determined to be 0.9847. (For the case of a constant forgetting factor, $\lambda=\lambda$, comprising a single-valued scalar quantity.) The optimal values for the individual forgetting factors employed in the lower plot were close to values shown in the inset table of FIG. 6A, which is discussed below. It is noted that the equilibrium potential $V_o$ in FIG. 3B shows more oscillation with time and follows the variation in the current source. In experimenting with the variable forgetting factors, it was learned that while a larger forgetting factor is appropriate for some parameters, the forgetting factor for $V_o$ must be smaller in order to capture SOC variations with current.

Hybrid electric vehicles with relatively small batteries relative to the energy content of the on-board fuel tank (e.g., gasoline) are run in a charge-sustaining mode, versus a vehicle that can charge off the electrical grid, often termed a plug-in hybrid. Charge-sustaining hybrids are more common, as the costs of the battery as well as that of the electric motors and power electronics are reduced relative to plug-in hybrids. To maintain charge-sustaining operation, the battery is cycled about a set point SOC, generally near 50% SOC; which comprises the focus of the analysis hereinbelow. Analogous to the data in FIG. 3B, the state of charge and measured, equilibrium and hysteresis voltages are shown with reference to FIG. 4; the algorithm was started at 4500 seconds, facilitating the analysis of algorithm operation about 50% SOC. The forgetting factors were optimized, as shown as discussed with reference to FIG. 5. Only the results for the case of variable forgetting factors are shown with reference to FIG. 4, as the results for the analogous, optimized, fixed forgetting factor was similar in appearance as plotted.

Referring again to FIG. 5, the influence of the forgetting factor on the error $\varepsilon_{opt}$ (Eq. 18), is now shown. The ordinate values correspond to the error $\varepsilon_{opt}$ normalized by that which is obtained for the optimal fixed forgetting factor (0.9847 for FIG. 5A and 0.9827 for FIG. 5B). The curve shown in FIG. 5A corresponds to the analyses of FIG. 3, and the curve shown in FIG. 5B corresponds to the analyses of FIG. 4. The error is increased by 18% (FIG. 5A) and 53% (FIG. 5B) in going to a fixed forgetting factor, relative to variable forgetting factors. Hence, employing a variable forgetting factor for a charge-sustaining hybrid utilizing a lithium-ion battery can be expected to increase the accuracy of the algorithm by about 50%. In support of the optimal fixed forgetting factors of 0.9847 and 0.9827 depicted in FIG. 5, a single (fixed) value of 0.99 was used in the prior art for lead acid, Nickel-Metal Hydride ('NiMH'), and lithium-ion cells. The optimization process employed in this work provides a quantitative basis for why a value near 0.99 worked well.

Figure 4:
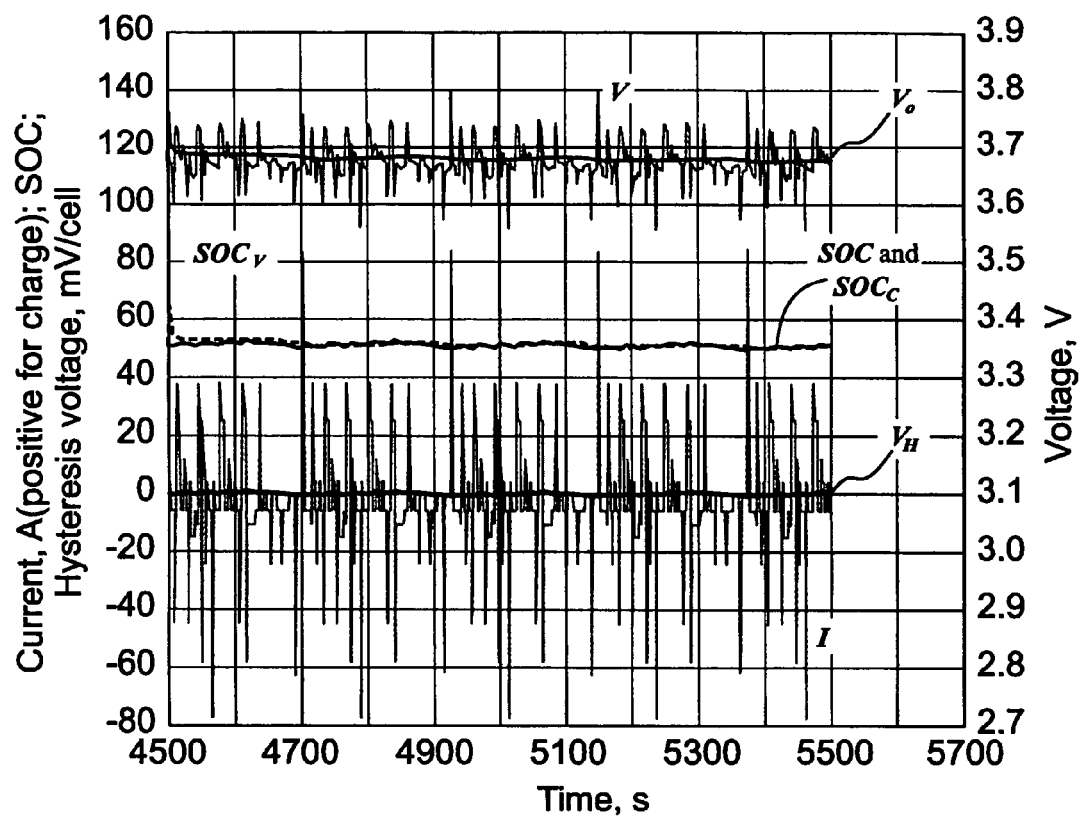
Figure 6A:
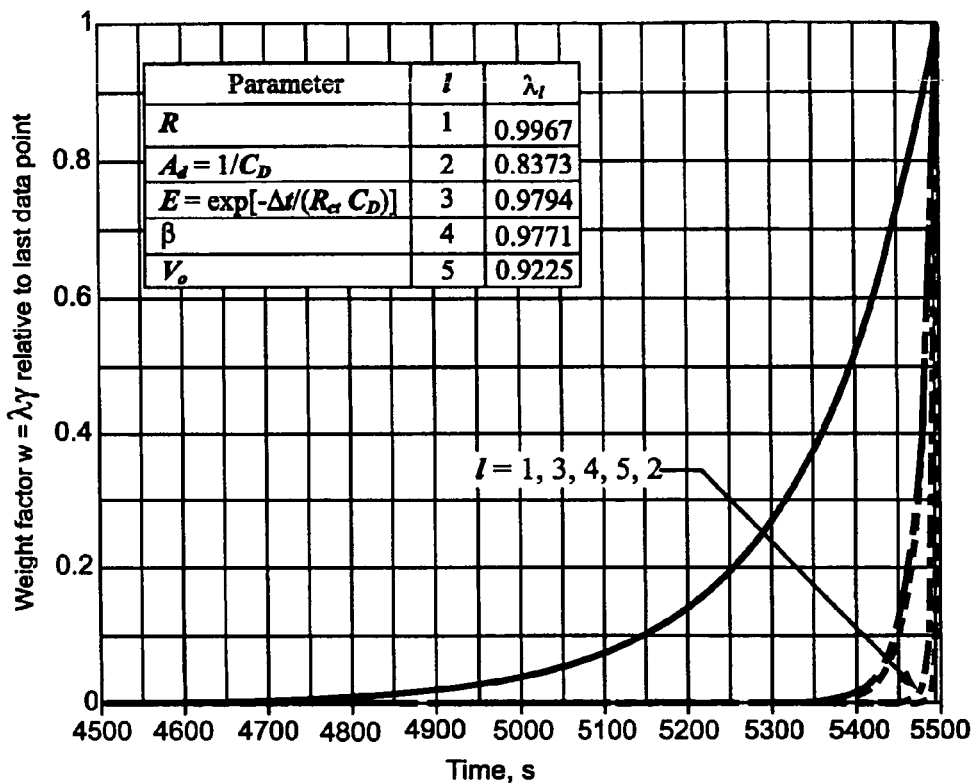
Figure 6B:
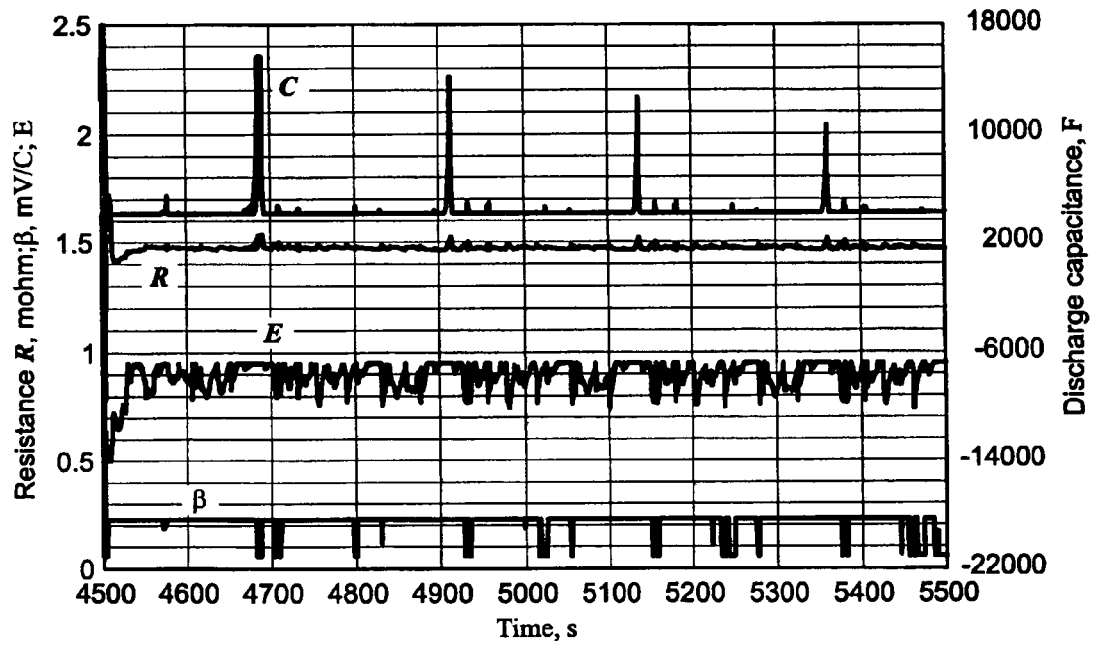

The optimized values for the variable forgetting factors and the associated parameter values $m_l$ are shown in FIG. 6A for the analysis shown in FIG. 4. Four of the extracted parameters are displayed in FIG. 6B, and the fifth ($V_o$) is shown in FIG. 4. The high-frequency resistance R is seen to be quite stable, and a large forgetting factor, reflecting time averaging over a longer duration, results from the optimization. Conversely, more rapid changes in the open-circuit potential are required for the high-power cycling regime, consistent with the discussion related to FIG. 3, resulting in a smaller forgetting factor for $V_o$. Lithium-ion and NiMH batteries are both insertion systems wherein the average concentration of ions in the entire electrolyte phase does not change on charge and discharge. For lithium-ion batteries on discharge, lithium ions are ejected from the carbon anode and inserted into the metal oxide cathode, and there is no net change in the number of ions within the electrolyte phase. The same conclusion holds for charge, wherein lithium ions are discharged from the metal oxide cathode and inserted into the carbon anode.

While it is known in the art that local concentration gradients will influence the cell potential to a first approximation, high-frequency resistance R is expected to be effectively constant over a drive profile, consistent with the secondary current distribution for the cell and a constant number of charge carriers in the electrolyte phase. The same arguments hold for protons for NiMH batteries. The fact that the algorithm yields a stable value for R is important in the context of SOH. The definition for state of health, is described in Eq. 20, below:

$$SOH = R_{nominal}(T,SOC)/R(T,SOC) \quad [20]$$

The SOH equation described above provides a means to quantify the term 'state of health'. In this relation, the nominal resistance for a new battery is $R_{nominal}$, which can be a tabulated calibrated quantity within the controller as a function of temperature and SOC. As will be seen below, the high-frequency resistance R plays a central role in determining the power capability; hence the defined SOH is a meaningful quantity, as the power capability of the battery is critically important to HEV operation. When battery electrodes degrade with time, R increases. For both lithium ion and NiMH batteries, the increase in R is often due to loss of particle-particle contact within the electrodes, the growth of ohmic layers over the particle surfaces, or the loss of solvent over time. By the definition provided with reference to Eq. 20, new batteries are expected to have an SOH value near unity, and the SOH declines as the battery ages. Alternatively, a short-circuit within a cell leads to an abnormally high value of SOH, significantly greater than unity, implying failure of the system.

Figure 7A:
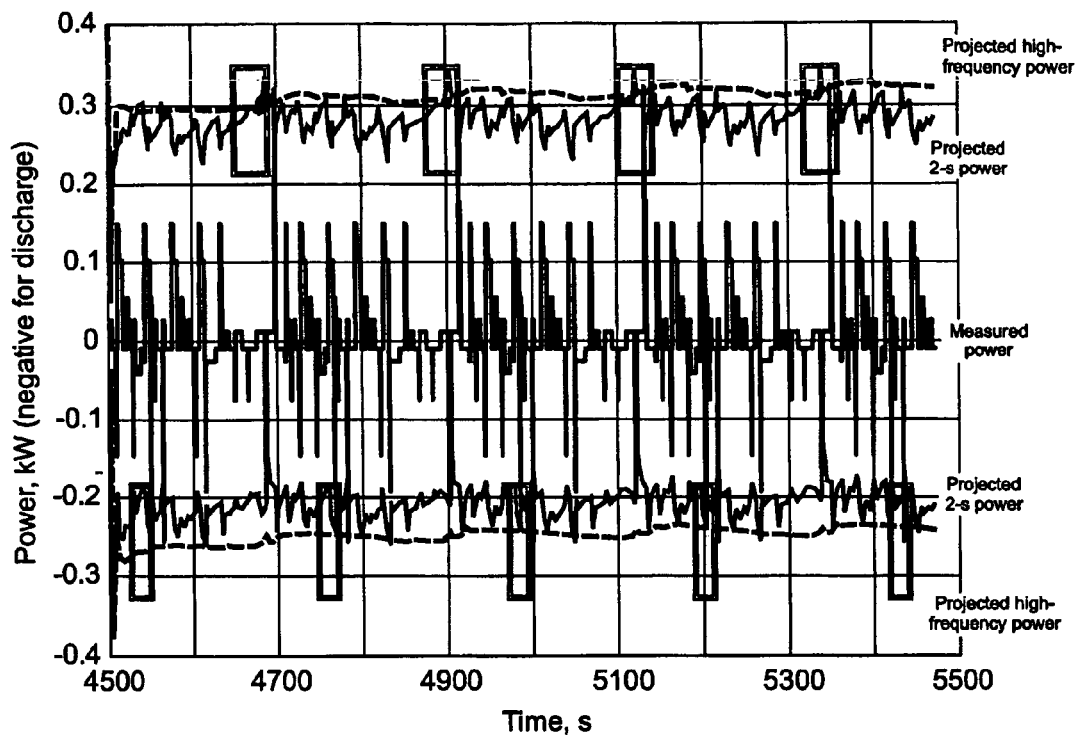
Figure 7B:
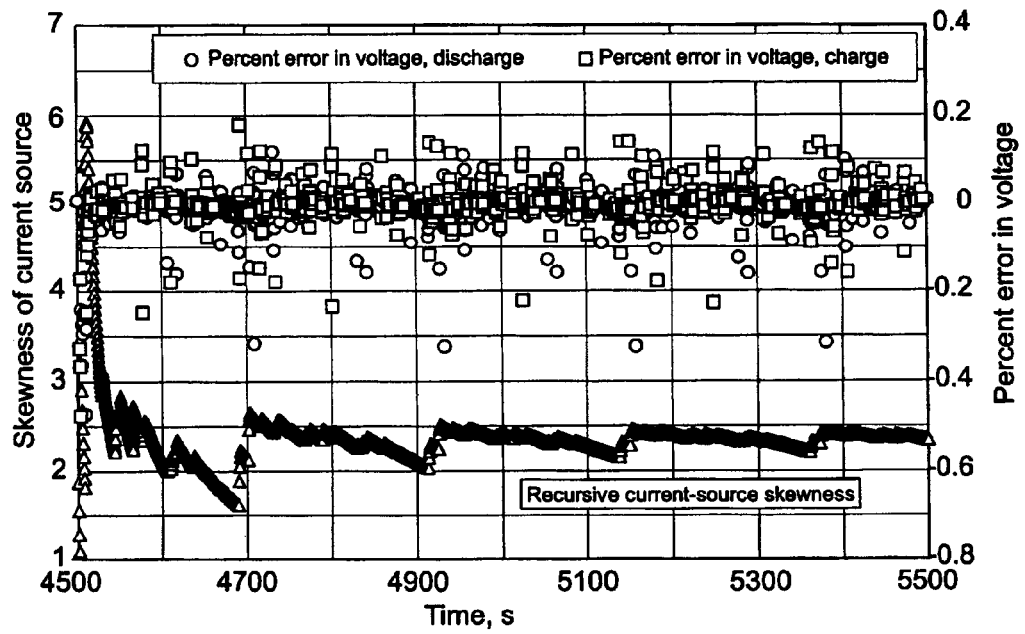

The remainder of the discussion is concerned with power projections provided by the algorithm. Eqs. 15 through 17, above, provide the necessary relations. Plots of the power projections provided by the algorithm along with the actual measured power are provided with reference to FIGS. 7 and 8. The skewness of the current source, depicted in FIG. 7B, is based on the relation, in Eq. 21, below:

$$\text{Skewness} = \left| \frac{1}{N\sigma^3} \sum_{j=1}^{j=N} (x_j - \bar{x})^3 \right|, \quad [21]$$

wherein $\bar{x}$ is the average of the x-values and $\sigma^2$ is a variance. In Eq. 21, x refers to the current excitation source. Large skewness in data can occur when the excitation source is substantially constant for a prolonged duration and then abruptly transitions to a new value of very different magnitude.

The equation is made fully recursive without approximation. The power, current-excitation skewness (Eq. 21), and percent error in voltage corresponding to the data in FIG. 4 are depicted in FIGS. 7A and 7B. The local maxima in skewness (shown at 5157 seconds) correspond to larger errors $\epsilon_{opt}$ in the voltage modeling, with the maximum error magnitudes slightly greater than 0.3%. The maximum charge and discharge power tests and projections are boxed in FIG. 7A. The power projections depicted correspond to the high-frequency (Eqs. 15 and 16) and 2-second power capability (Eq. 17), with the latter comprehending the capacitive behavior of the system.

Figure 8:
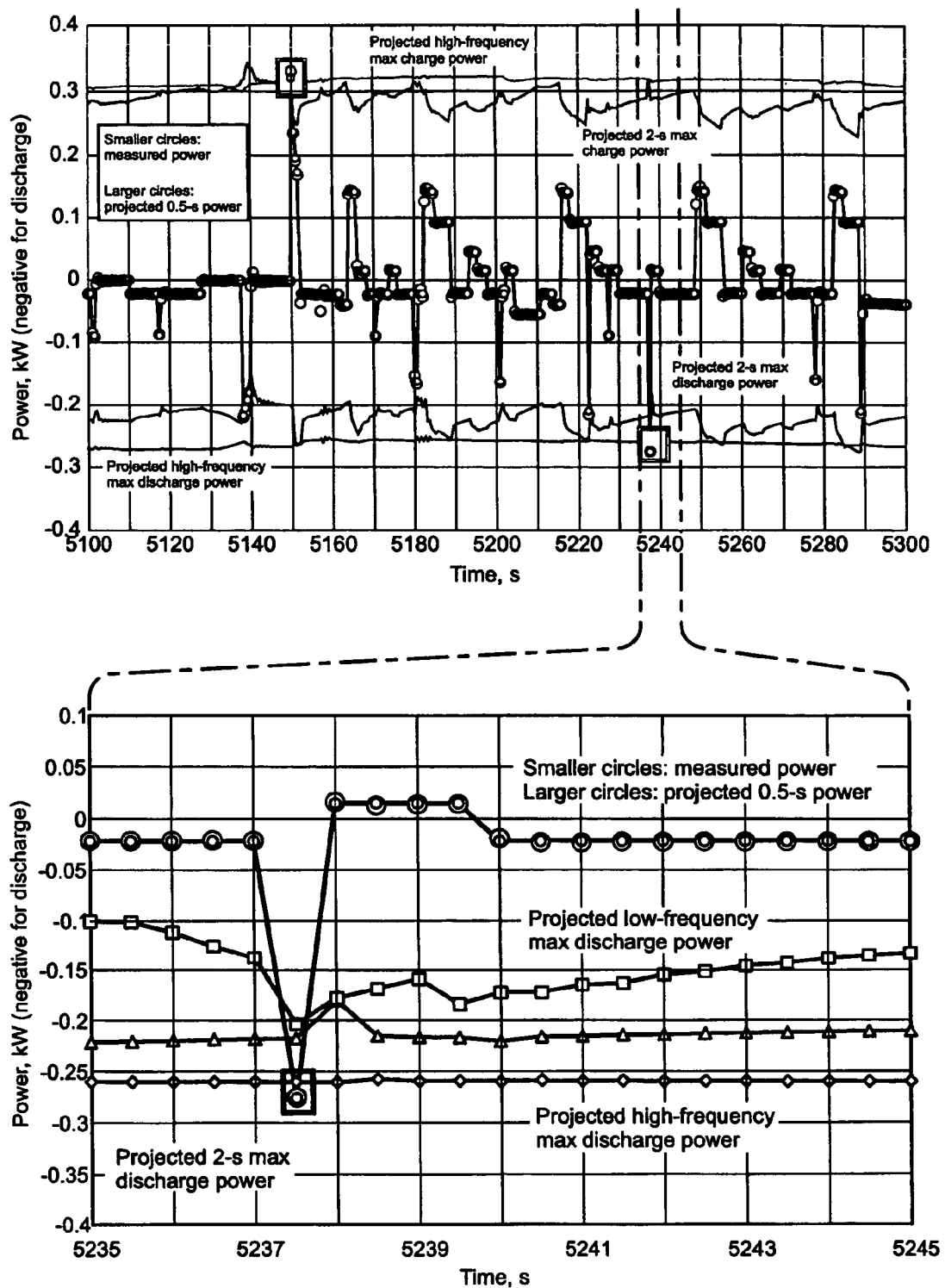

An expanded view of power projections is displayed with reference to FIG. 8. In addition to the traces shown with reference to FIGS. 7A and 7B, the low-frequency discharge-power capability, calculable using Eqs. 15 and 16 with the resistance corresponding to $R+R_{ct}$, is included, and the 0.5-second power projection (large circles, $\Delta t=0.5$ seconds for the implementation of Eq. 17) is shown to accurately predict the measured power; that is, using past information and the voltage set point taken to be that which is 0.5 seconds into the future, the algorithm predicts the measured power with high accuracy.

Due to charging and discharging of the capacitor 26 circuit element (shown with reference to FIG. 1) the 0.5-second power-projection magnitudes may exceed those of the high-frequency projection. Therefore, conservative battery operation is accomplished by employing the 2-second maximum power projection as the system's maximum power capability for the next 0.5 seconds; i.e., the risk of the voltage exceeding or dropping below the maximum or minimum voltage, respectively, is very low when the 2-second maximum power projection is employed to represent battery's maximum power capability for the next 0.5 seconds. The maximum error in the 0.5-second power projection is shown in FIG. 7A at 5157 seconds, and is addressed in the skewness analysis of FIG. 7B.

The invention has been described with specific reference to an embodiment comprising estimating a state of electrical charge for a battery storage device, and modifications thereto. It is understood that the scope of the invention encompasses all methods and systems for control and monitoring using a state estimator having individually variable forgetting factors, as described hereinabove. The invention is therefore applicable to determining state of power or state of health of the battery, as referred to hereinabove. Further modifications and alterations may occur to others upon reading and understanding the specification. It is intended to include all such modifications and alterations insofar as they come within the scope of the invention.

Having thus described the invention, it is claimed:

1. Method to recursively estimate a state associated with an electrical energy storage device, comprising:
   a) constructing an executable multivariate mathematical model of the electrical energy storage device operable to estimate a state associated with the electrical energy storage device, comprising: an equation summing a plurality of sensed data signals, each sensed data signal factored by: one of a corresponding plurality of weighting factors; and further factored by one of a corresponding plurality of parameters;
   b) sensing each of the sensed data signals at a time-certain;
   c) updating each of the plurality of parameters, comprising:
      i) creating a weighted recursive least squares equation to calculate a parameter based upon the executable multivariate mathematical model of the electrical energy storage device; and,
      ii) executing the weighted recursive least squares equation to calculate each of the parameters, based upon: the sensed data signals at the time-certain, the weighting factors, and, non-corresponding parameters determined at a preceding time-certain; and
   d) executing the multivariate mathematical model of the electrical energy storage device to estimate the state associated with the electrical energy storage device using the updated plurality of parameters, the sensed data signals at the time-certain, and the weighting factors.

2. The method of claim 1, comprising recursively executing the multivariate mathematical model of the electrical energy storage device to estimate the state associated with the electrical energy storage device using the updated plurality of parameters, the sensed data signals at the time-certain, and the weighting factors.

3. The method of claim 1, wherein estimating a state associated with the electrical energy storage device comprises estimating a state of charge of the electrical energy storage device.

4. The method of claim 1, wherein estimating a state associated with the electrical energy storage device comprises estimating a state of health of the electrical energy storage device.

5. The method of claim 1, wherein estimating a state associated with the electrical energy storage device comprises estimating a state of power of the electrical energy storage device.

6. The method of claim 1, wherein determining the input at a time-certain comprises sensing the input.

7. The method of claim 1, further comprising decaying at least one of the weighting factors using exponential forgetting factors.

8. The method of claim 7, further comprising decaying at least one of the weighting factors using exponential forgetting factors based upon elapsed time.

9. The method of claim 1, further comprising decaying at least one of the weighting factors based upon a characteristic of the device.

* * * * *